(12) United States Patent
Nguyen

(10) Patent No.: US 11,710,621 B2
(45) Date of Patent: Jul. 25, 2023

(54) DIRECT LIFT CATHODE FOR LITHOGRAPHY MASK CHAMBER

(71) Applicant: Applied Materials, Inc., Santa Clara, CA (US)

(72) Inventor: Khiem Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 17/242,685

(22) Filed: Apr. 28, 2021

(65) Prior Publication Data

US 2022/0351949 A1 Nov. 3, 2022

(51) Int. Cl.
*G03F 7/20* (2006.01)
*H01J 37/32* (2006.01)
*G03F 7/00* (2006.01)

(52) U.S. Cl.
CPC .... *H01J 37/32715* (2013.01); *G03F 7/70716* (2013.01); *H01J 2237/20235* (2013.01)

(58) Field of Classification Search
CPC ...... H01J 37/32715; H01J 2237/20235; G03F 7/70716
See application file for complete search history.

(56) References Cited

U.S. PATENT DOCUMENTS

| 2007/0007660 A1 | 1/2007 | Nguyen et al. |
| 2014/0255830 A1 | 9/2014 | Wu et al. |
| 2017/0139334 A1 | 5/2017 | Rye et al. |
| 2019/0189499 A1 | 6/2019 | Strassner et al. |
| 2021/0028052 A1 | 1/2021 | So et al. |
| 2021/0183693 A1* | 6/2021 | Costa .................... H01L 21/786 |

FOREIGN PATENT DOCUMENTS

TW 201939579 A 10/2019

OTHER PUBLICATIONS

Application No. PCT/US2022/024222, International Search Report and Written Opinion, dated Jul. 27, 2022, 8 pages.

* cited by examiner

*Primary Examiner* — Mesfin T Asfaw
(74) *Attorney, Agent, or Firm* — Kilpatrick Townsend & Stockton LLP

(57) ABSTRACT

Exemplary lithography mask processing chambers may include a substrate support that includes a plurality of lift pins that are vertically translatable relative to a top surface of the substrate support. The lithography mask processing chambers may include a cover ring positioned atop the substrate support. The cover ring may define a rectilinear substrate seat. A top surface of the rectilinear substrate seat may be elevated above the top surface of the substrate support. An outer periphery of the rectilinear substrate seat may be positioned outward of the plurality of lift pins.

19 Claims, 8 Drawing Sheets

DIRECT LIFT CATHODE FOR LITHOGRAPHY MASK CHAMBER

TECHNICAL FIELD

The present technology relates to semiconductor processes and equipment. More specifically, the present technology relates to selectively etching mask structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary lithography mask processing chambers may include a substrate support that includes a plurality of lift pins that are vertically translatable relative to a top surface of the substrate support. The lithography mask processing chambers may include a cover ring positioned atop the substrate support. The cover ring may define a rectilinear substrate seat. A top surface of the rectilinear substrate seat may be elevated above the top surface of the substrate support. An outer periphery of the rectilinear substrate seat may be positioned outward of the plurality of lift pins.

In some embodiments, the top surface of the rectilinear substrate seat may be elevated above the top surface of the substrate support by a distance of between about 5 mils and 50 mils. The rectilinear substrate seat may define an aperture through a thickness of the cover ring. A portion of the substrate support may protrude partially through the aperture. The rectilinear substrate seat may include a step that extends about at least a portion of the aperture. The step may be sized to support peripheral edges of a wafer that is to be processed within the lithography mask processing chamber. A peripheral edge of the rectilinear substrate seat may be sized such that the peripheral edge of the rectilinear substrate seat is spaced apart from a peripheral edge of a wafer being processed by between about 10 mils and 100 mils. The substrate support may be operable as a cathode. Each of the plurality of lift pins may be positioned equidistant from a center of the substrate support. The plurality of lift pins may be positioned at equal angular intervals relative to the center of the substrate support. The plurality of lift pins may include at least three lift pins. Each of the plurality of lift pins may be vertically translatable between a raised position in which a top of each of the plurality of lift pins extends above a top surface of the cover ring and a lowered position in which the top of each of the plurality of lift pins is below a top surface of the substrate support.

Some embodiments may include exemplary lithography mask processing chambers. The lithography mask processing chambers may include a substrate support that includes three or more lift pins that are vertically translatable relative to a top surface of the substrate support. The substrate support may be operable as a cathode. The lithography mask processing chambers may include a cover ring positioned atop the substrate support. The cover ring may define a rectilinear substrate seat that defines a rectilinear central aperture. A top surface of the rectilinear substrate seat may be elevated above the top surface of the substrate support. An outer periphery of the rectilinear substrate seat may be positioned outward of the three or more lift pins.

In some embodiments, the cover ring may extend over an entire upward facing surface of the substrate support that is radially outward of the rectilinear central aperture. The substrate support may include a rectilinear inner portion and an outer portion. The rectilinear inner portion may be raised relative to the outer portion. The rectilinear inner portion may have a smaller area than the rectilinear central aperture. The rectilinear inner portion may extend upward through a portion of the rectilinear central aperture. The cover ring may include hexagonal boron nitride. The rectilinear substrate seat may include a step that extends about at least a portion of the rectilinear central aperture. The step may be sized to support peripheral edges of a wafer that is to be processed within the lithography mask processing chamber. Each of the three or more lift pins may be vertically translatable between a raised position in which a top of each of the three or more lift pins extends above a top surface of the cover ring and a lowered position in which the top of each of the three or more lift pins is below a top surface of the substrate support. The three or more lift pins may be positioned equidistant from a center of the substrate support. The three or more lift pins may be positioned at equal angular intervals relative to the center of the substrate support.

Some embodiments may include methods of processing a lithography mask substrate. The methods may include translating a plurality of lift pins upward into a receiving position in which a top surface of each of the plurality of lift pins extends above a top surface of a cover ring. The methods may include receiving a lithography mask substrate atop the plurality of lift pins. The methods may include translating the plurality of lift pins downward to a lowered position to position the lithography mask substrate within a rectilinear substrate seat defined within the cover ring. In the lowered position each of the plurality of lift pins may be retracted within a body of a substrate support that is positioned beneath the cover ring. In some embodiments, the methods may include translating the plurality of lift pins upward into the receiving position to raise the lithography mask substrate out of the rectilinear substrate seat upon performing the one or more processing operations.

Such technology may provide numerous benefits over conventional systems and techniques. For example, by positioning the lift pins directly beneath the substrate and supporting peripheral edges of the substrate with a substrate seat, a backside of the substrate may be sealed from plasma during processing operations. This may protect the backside of the substrate from any etching and/or other damage from the plasma. Additionally, by moving the lift pins inward on the substrate support, the substrate support and/or chamber may be reduced in size. This may help improve the conductance and pressure uniformity within the chamber, and, more particularly, across the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
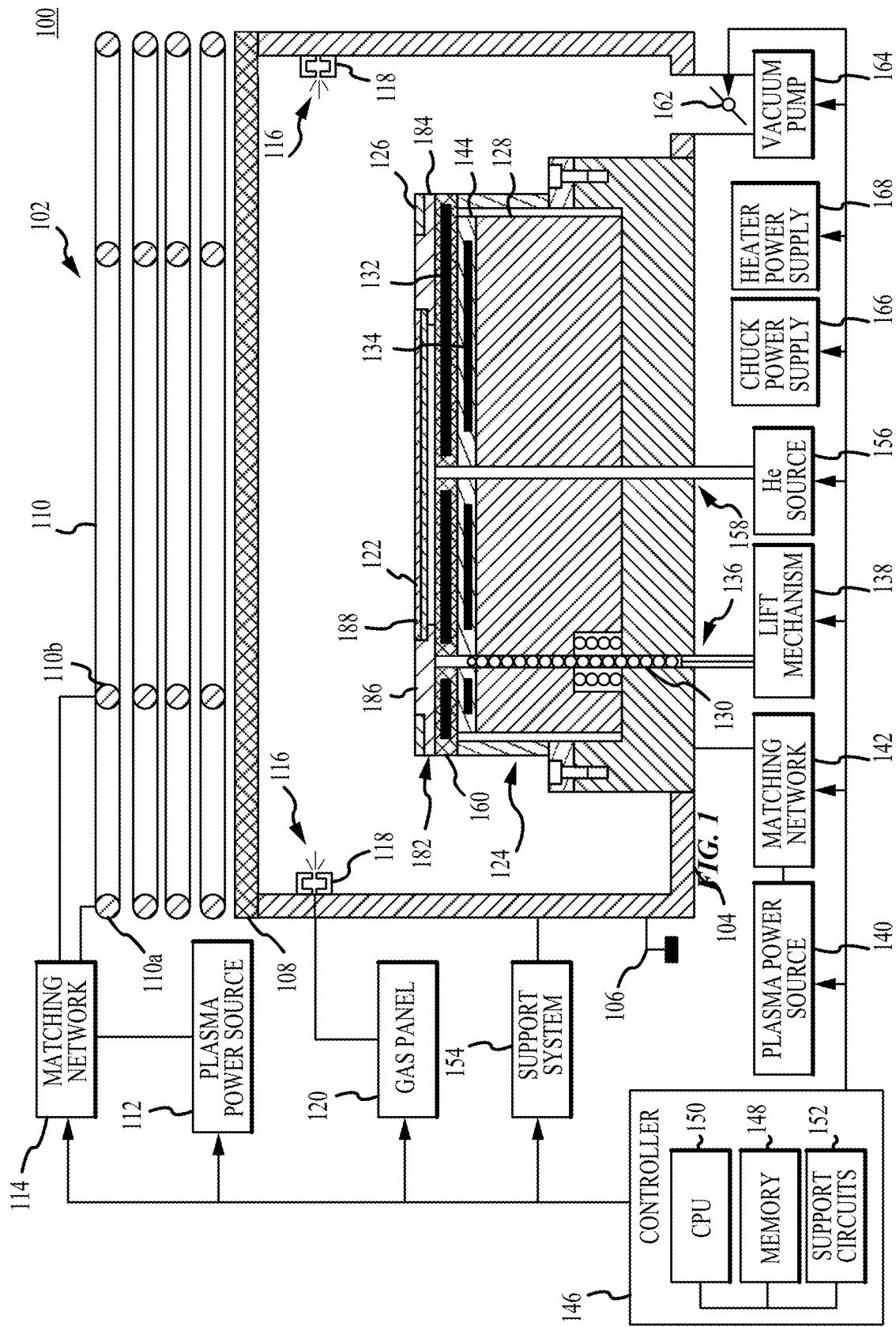
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

When processing semiconductor structures, such as lithography masks and/or other substrates, the substrate may need to be lifted off of a substrate support or other structure to facilitate transfer and positioning of the substrate within the semiconductor processing chamber. Conventional lithography mask processing chambers may raise and lower substrates using capture rings, which may extend at least partially about the periphery of the substrate and which have lifting surfaces that are aligned with corners and/or edges of the substrate. The capture ring itself may be raised and lowered using a number of lift pins that are positioned outward of the substrate. However, in conventional designs the lifting surfaces of the capture ring are vertically spaced apart from a lower surface of the substrate during processing. This creates a gap that enables plasma to enter and etch away a portion of the backside of the mask substrate.

The present technology overcomes these limitations by eliminating the capture ring and instead uses lift pins to directly lift the substrate. For example, the lift pins may be moved inward within the substrate support and vertically aligned with the substrate. In this manner, the lift pins may raise and lower the substrate, while enabling the substrate to be supported within a substrate seat defined by a cover ring that sits atop the substrate support. Bottom edges of the substrate may be directly positioned on the substrate seat to seal the backside of the substrate from any plasma and may prevent any etching of material on the backside of the substrate. Additional benefits may be provided by such a design. In particular, by moving the lift pins inward, a size of the substrate support and/or chamber may be reduced, which may lead to improvements in the conductance and pressure uniformity within the chamber. Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with any specific processes or materials alone. Moreover, although an exemplary chamber is described to provide foundation for the present technology, it is to be understood that the present technology can be applied to virtually any semiconductor processing chamber that may allow the operations described.

FIG. 1 shows a schematic cross-sectional view of an exemplary processing chamber 100 according to some embodiments of the present technology. Processing chamber 100 may generally include a process chamber body 102 having a substrate support 124 or pedestal, and a controller 146. The chamber body 102 may have a conductive wall 104 that may support a substantially flat dielectric ceiling 108. Other embodiments of the processing chamber 100 may have other types of ceilings, such as a dome-shaped ceiling, or sloped ceiling. An antenna 110 may be disposed above the ceiling 108. The antenna 110 may include one or more inductive coil elements, such as co-axial elements 110a and 110b, which may be selectively controlled. The antenna 110 may be coupled through a first matching network 114 with a plasma power source 112. The plasma power source 112 may be capable of producing up to about 3000 W at a tunable frequency in a range from about 50 kHz to about 13.56 MHz.

The substrate pedestal 124 may be operated as a cathode in some embodiments, and may be coupled through a second matching network 142 with a biasing power source 140. The biasing source 140 may provide up to about 600 W at a tunable continuous wave, as well as a pulse frequency in the range of about 1 kHz to about 10 kHz. The biasing source 140 may produce pulsed RF power output, or the biasing source 140 may produce pulsed DC power output. As noted previously, source 140 may also provide a constant DC and/or RF power output. Substrate support 124 may include an electrostatic chuck 160. The electrostatic chuck 160 may include at least one clamping electrode 132 and may be controlled by a chuck power supply 166. In some embodiments, the substrate support 124 may include additional substrate retention mechanisms such as a susceptor clamp ring, a vacuum chuck, a mechanical chuck, or any other mechanical or other configuration to maintain a substrate in place during processing or etching operations.

A gas panel 120 may be coupled with the processing chamber 100 to provide process and/or other gases to the interior of the process chamber body 102. In some embodiments as illustrated, the gas panel 120 may be coupled with one or more inlets 116 formed in a channel 118 in the conductive wall 104 of the chamber body 102. The one or more inlets 116 may be provided in other locations as well, such as, for example, in the ceiling 108 of the processing chamber. The pressure in the processing chamber 100 may be controlled using a throttle valve 162 and a vacuum pump 164. The vacuum pump 164 and throttle valve 162 may be capable of maintaining chamber pressures in the range of about 1 mTorr to about 50 mTorr during processing operations. The temperature of the wall 104 may be controlled using liquid-containing conduits, which may run through the wall 104 in any number of continuous or segmented patterns. Wall temperature may be generally maintained at or below room temperature. In some embodiments, the chamber wall 104 may be formed from a metal, such as or including aluminum, stainless steel, or other metals used in semiconductor processing chambers, and chamber wall 104 may be coupled with an electrical ground 106. The processing chamber 100 may also include a number of additional systems for process control, internal diagnostics, end point detection, or other operations that may facilitate semiconductor processing, and each of these systems are collectively shown as support systems 154.

A reticle adapter 182 may be used to secure a substrate, such as a reticle or other substrate 122, onto the substrate support 124. The reticle adapter 182 generally may include a lower portion 184 milled to cover an upper surface of the substrate support 124, such as the electrostatic chuck 160, for example, and a top portion 186 having an opening 188 that may be sized and shaped to hold the substrate 122. The opening 188 may be generally or substantially centered with respect to the substrate support 124. The adapter 182 may be generally formed from a single piece of etch resistant, high temperature resistant material such as polyimide ceramic or quartz. An edge ring 126 may cover and/or secure the adapter 182 to the pedestal 124 as shown. A lift mechanism 138 may be used to lower or raise the adapter 182, and hence, the substrate 122, onto or off of the substrate support 124. Generally, the lift mechanism 138 may be or include a plurality of lift pins, such as lift pin 130 shown, which may travel through respective guide holes 136.

In operation, the temperature of the substrate 122 may be controlled by stabilizing the temperature of the substrate support 124. In some embodiments, the substrate support 124 may include a heater 144 and/or an optional heat sink 128. The heater 144 may be one or more fluid conduits configured to receive and direct a heat transfer fluid through channel for maintaining temperature. Additionally, the heater 144 may be or include at least one heating element 134 that may be regulated by a heater power supply 168. A backside gas, such as helium or any other gas, from a gas source 156 may be provided via a gas conduit 158 to channels that may be formed in the pedestal surface under the substrate 122. The backside gas may be used to facilitate heat transfer between the substrate support 124 and the substrate 122. During processing, the substrate support 124 may be heated by the embedded heater 144 to a steady-state temperature, which in combination with the helium backside gas, may facilitate uniform heating of the substrate 122.

The controller 146 may include a central processing unit ("CPU") 150, a memory 148, and support circuits 152 for the CPU 150, which may facilitate control of the components of the processing chamber 100 and of an etch process, such as processes or operations discussed below in further detail. The controller 146 may be one of any form of general-purpose computer processor that can be used in an industrial setting for controlling various chambers and sub-processors. The memory 148 of the CPU 150 may be one or more of readily available memory such as random-access memory, read-only memory, floppy disk, hard disk, or any other form of digital storage, local or remote. The support circuits 152 may be coupled with the CPU 150 for supporting the processor in any number of ways as would be readily understood by the skilled artisan. The support circuits may include cache, power supplies, clock circuits, input/output circuitry and subsystems, as well as any other operational component. Processes or operations generally may be stored in the memory 148 or other computer-readable medium accessible to the CPU 150 as a software routine. Alternatively, a software routine may also be stored and/or executed by a second CPU that is remotely located from the hardware being controlled by the CPU 150.

Figure 2:
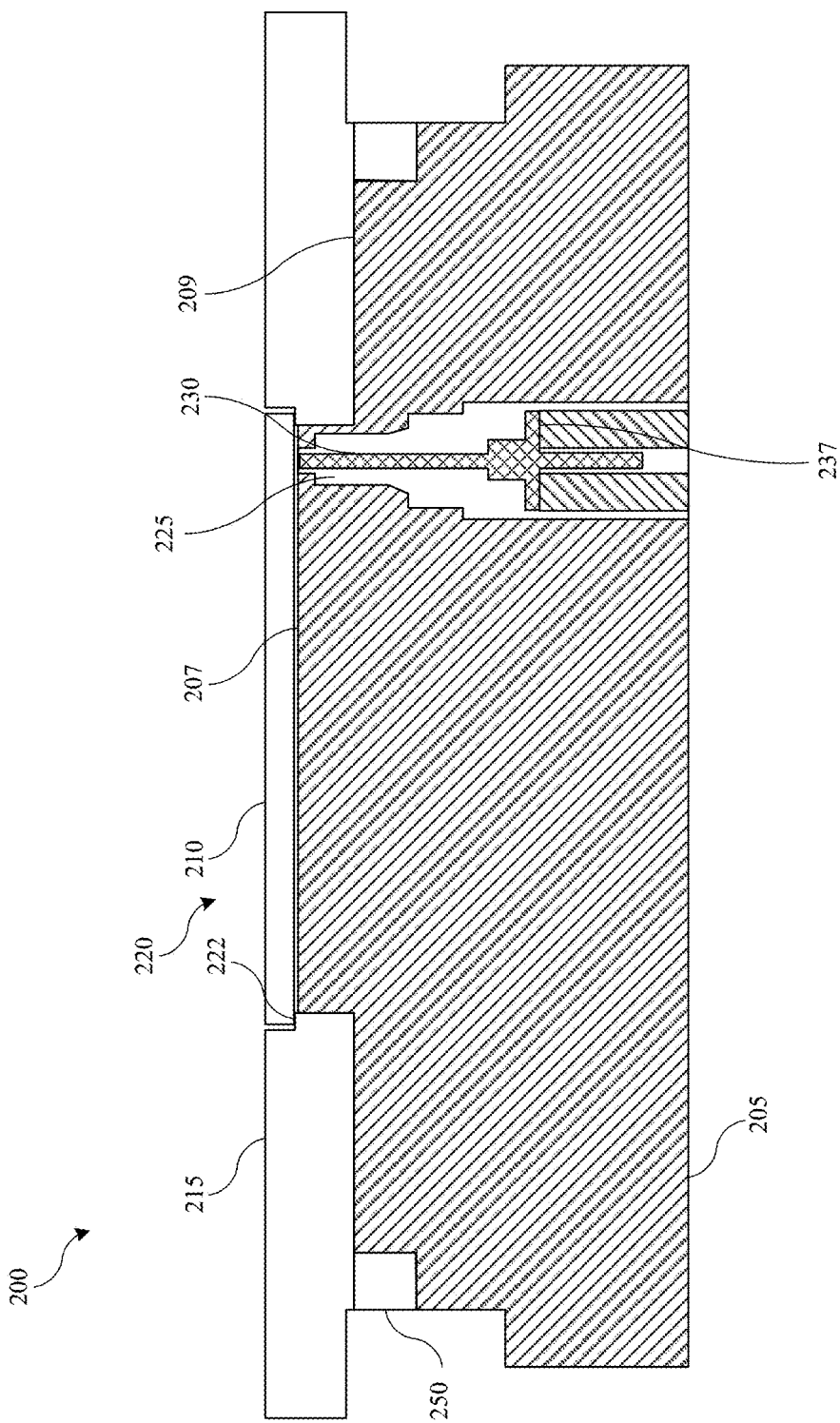
FIG. 2 shows a partial schematic cross-sectional view of an exemplary processing chamber according to some embodiments of the present technology.

FIG. 2 shows a schematic partial cross-sectional view of an exemplary processing chamber 200 according to some embodiments of the present technology. FIG. 2 may illustrate further details relating to components in chamber 100, such as for pedestal 124. Chamber 200 is understood to include any feature or aspect of chamber 100 discussed previously in some embodiments. The chamber 200 may be used to perform any number of processing operations including deposition, etching, removal, polishing, and/or cleaning operations on semiconductor structures, including lithography masks, as previously described. Chamber 200 may show a partial view of the chamber components being discussed and that may be incorporated in a semiconductor processing system, and may illustrate a view across a center of the substrate support, which may otherwise be of any size. Any aspect of chamber 200 may also be incorporated with other processing chambers or systems as will be readily understood by the skilled artisan.

Chamber 200 may include a pedestal or substrate support 205, similar to substrate support 124, that may extend through the base of the chamber 200 as previously discussed. The substrate support 205 may be operated as a cathode and/or may include an electrostatic chuck having one or more clamping electrodes in various embodiments. The substrate support 205 may include additional substrate retention mechanisms such as a susceptor clamp ring, a vacuum chuck, a mechanical chuck, and/or any other mechanical or other configuration to maintain a substrate 210 in place during processing or etching operations. The substrate support 205 may be formed of a conductive material, such as an aluminum alloy. The substrate support 205 may include an inner portion 207 and an outer portion 209 that extends around the inner portion 207. The inner portion 207 and outer portion 209 may be coaxial with the substrate support 205. The inner portion 207 may be raised relative to the outer portion 209 such that a top surface 211 of the inner portion 207 protrudes above a top surface of the outer portion 209. The inner portion 207 may be sized and shaped to closely mimic the size and shape of the substrate 210, such as a lithography mask wafer, that is to be processed within chamber 200. For example, the inner portion 207 may have a rectilinear shape and may have a size that is slightly smaller than a size of the substrate 210. For example, a width of the inner portion 207 may be less than or about 99.5% of a width of the substrate 210, less than or about 99% of a width of the substrate 210, less than or about 98% of a width of the substrate 210, less than or about 97% of a width of the substrate 210, less than or about 96% of a width of the substrate 210, less than or about 95% of a width of the substrate 210, or less. In some embodiments, a difference in widths of the inner portion 207 and the substrate 210 may be less than or about 10 mm, less than or about 8 mm, less than or about 6 mm, less than or about 5 mm, less than or about 4 mm, less than or about 3 mm, less than or about 2 mm, less than or about 1 mm, or less.

Chamber 200 may include a cover ring 215, which may sit atop and cover a portion of the substrate support 205. For example, the cover ring 215 may cover the outer portion 209, while the top surface 211 of the inner portion 207 remains exposed. In some embodiments, a liner and/or other spacer 250 may be positioned between a portion of the substrate support 205 and cover ring 215. The cover ring 215 may be similar to reticle adapter 182 described above. For example, the cover ring 215 may be generally formed from a single piece of etch resistant, high temperature resistant material such as hexagonal boron nitride, aluminum nitride, and/or other dielectric material. The cover ring 215 may define a pocket or substrate seat 220, which may be sized and shaped to receive and support the substrate 210. For example, the substrate seat 220 may have a rectilinear shape to match a shape of the substrate 210. The substrate seat 220 may include a step 222 that supports a bottom surface of the substrate 210. The step 222 may extend around all or part of an outer periphery of the substrate 210. The step 222 may be sized to support peripheral edges of the substrate 210. For example, opposing inner surfaces of the step 222 may be spaced apart by a distance that is less than or about 99.5% of a width of the substrate 210, less than or about 99% of a width of the substrate 210, less than or about 98% of a width of the substrate 210, less than or about 97% of a width of the substrate 210, less than or about 96% of a width of the substrate 210, less than or about 95% of a width of the substrate 210, or less. In some embodiments, a difference in a distance between opposing inner surfaces of the step 222 and a width of the substrate 210 may be less than or about 10 mm, less than or about 8 mm, less than or about 6 mm, less than or about 5 mm, less than or about 4 mm, less than or about 3 mm, less than or about 2 mm, less than or about 1 mm, or less. This may enable the peripheral edges of the substrate 210 to be seated atop a top surface 224 of step 222, which may protect the backside of the substrate 210 from etching or other damage due to plasma exposure during processing operations.

Figure 2A:
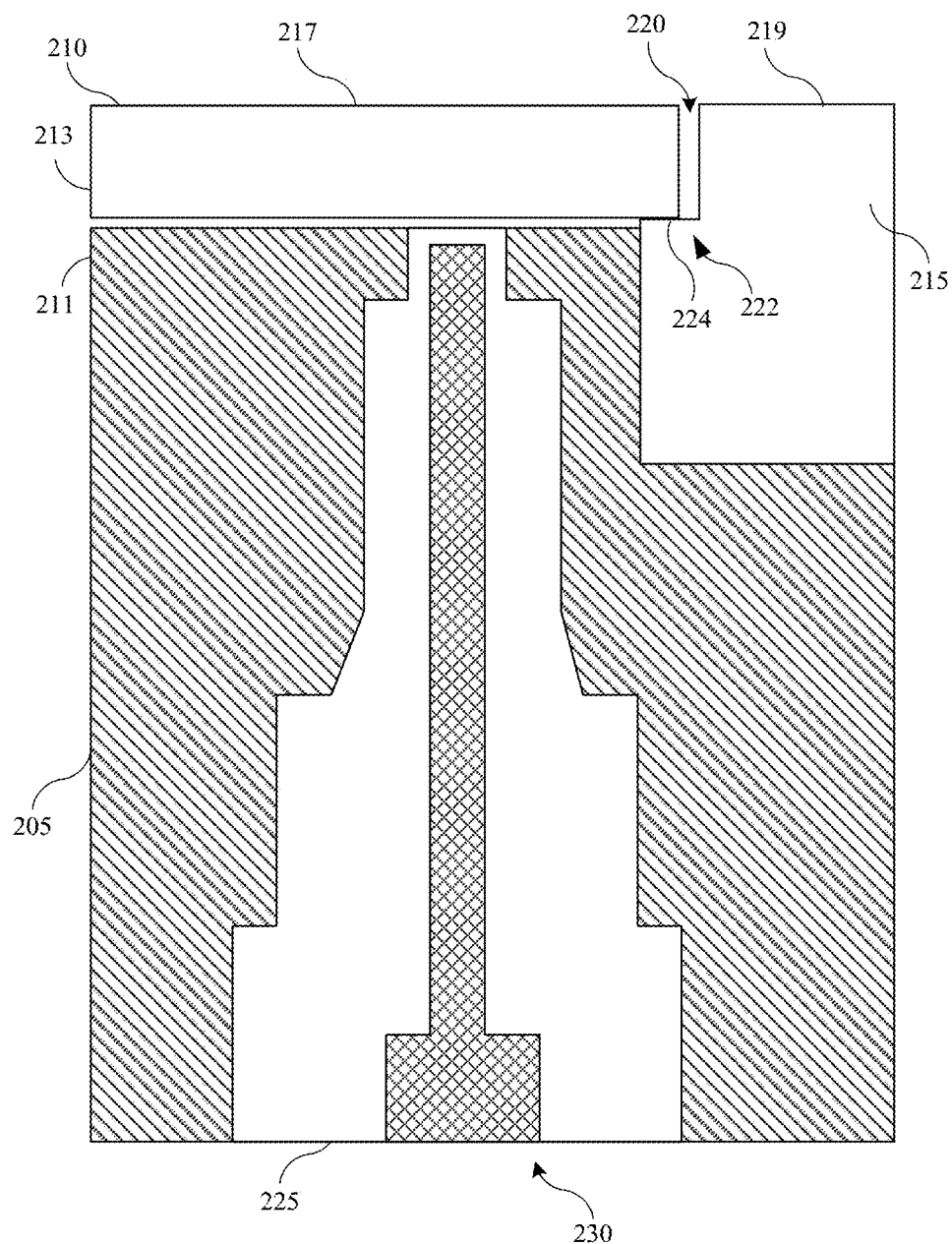
FIG. 2A shows a partial schematic cross-sectional view of the processing chamber of FIG. 2 with lift pins in a lowered position.

As best illustrated in FIG. 2A, peripheral edges of the substrate 210 may be spaced apart from outer faces of the step 222. For example, the peripheral edge of the substrate 210 may be spaced apart from the nearest outer face or peripheral edge of the step 222 by between or about 10 mils and 100 mils, between or about 20 mils and 90 mils, between or about 30 mils and 80 mils, or between or about 40 mils and 70 mils.

The substrate seat 220 may define a central aperture that extends between the opposing inner surfaces of step 222. The central aperture may be aligned with and provide access to the inner portion 207 of the substrate support 205. For example, the inner portion 207 of the substrate support 205 may be smaller than the central aperture and may protrude and/or otherwise extend upward into the central aperture such that a portion of the inner portion 207 is received within the central aperture. In such embodiments, the cover ring 215 may extend over and cover an entire upward facing surface of the substrate support 205 that is radially outward of the central aperture (e.g., a top surface of the outer portion 209). A top surface 211 of the inner portion 207 may be positioned slightly lower than the top surface 224 of step 222 such that a bottom surface 213 of the substrate 210 is spaced apart from the top surface 211 of the inner portion 207 when the substrate 210 is supported atop the step 222. For example, the bottom surface 213 of the substrate 210 may be spaced apart from the top surface 211 of the substrate support 205 by between about 5 mils and 50 mils, between about 10 mils and 40 mils, or between about 15 mils and 30 mils. This enables peripheral edges of the bottom surface 213 of the substrate 210 to sit atop the step 222 and seal the inner portion 207 of the substrate support 205 from process gases and/or plasma. Additionally, this may protect the backside of the substrate 210 from exposure to plasma and/or process gases. When supported on the step 222, a top surface 217 of the substrate 210 may be substantially aligned with a top surface 219 of the cover ring 215. This may create a level surface that helps to keep precursor and/or plasma flow more uniform over the substrate 210.

Figure 2B:
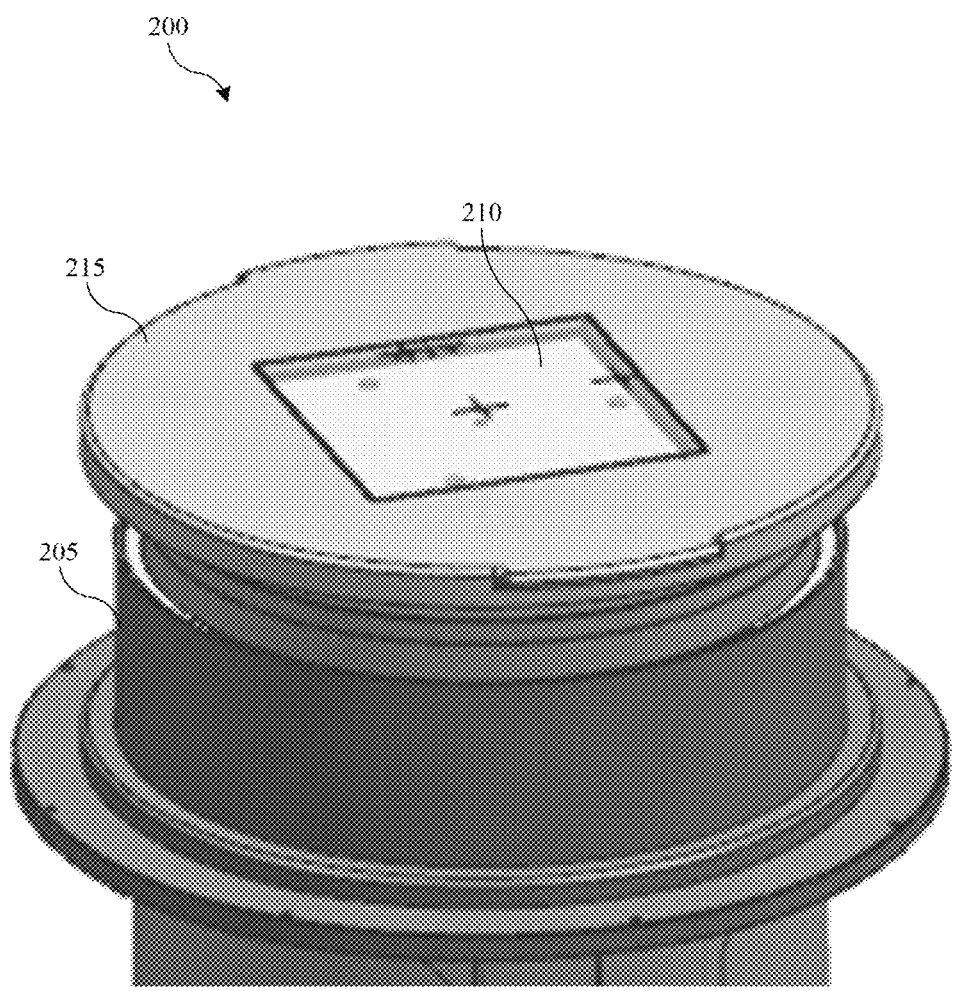
FIG. 2B shows a partial isometric view of the processing chamber of FIG. 2 with lift pins in a lowered position.
Figure 2C:
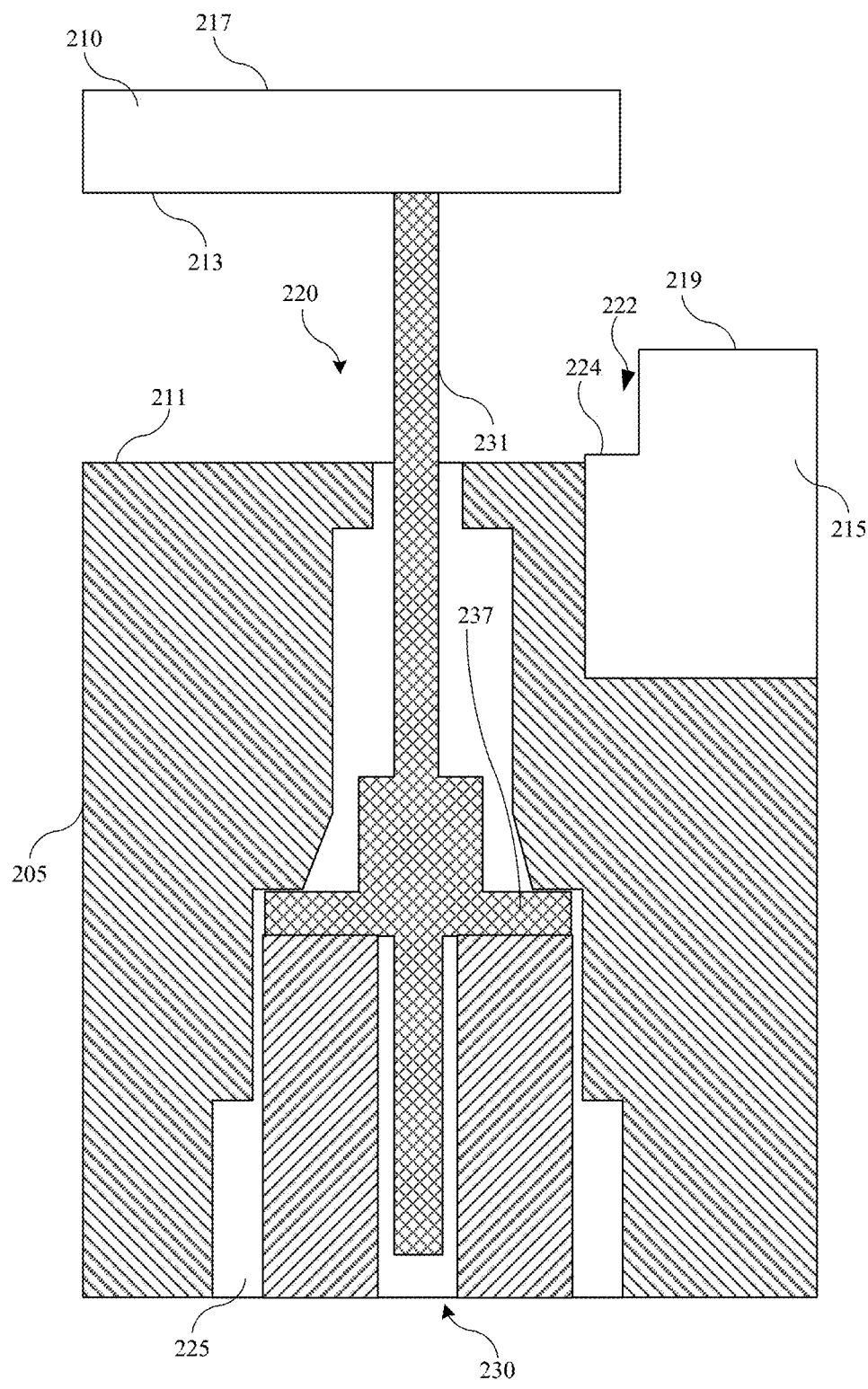
FIG. 2C shows a partial schematic cross-sectional view of the processing chamber of FIG. 2 with lift pins in a raised position.
Figure 2D:
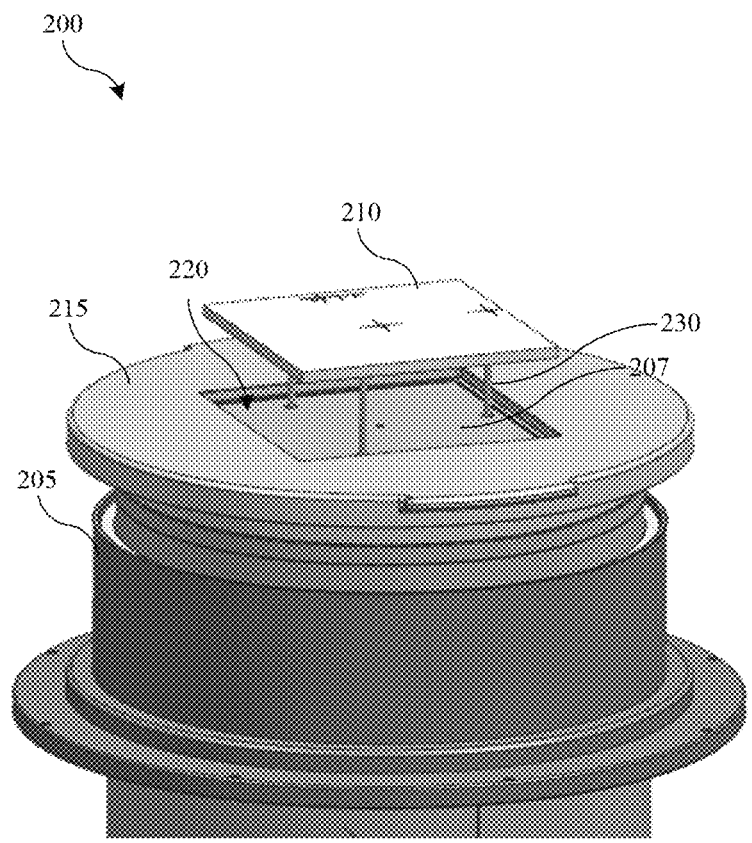
FIG. 2D shows a partial isometric view of the processing chamber of FIG. 2 with lift pins in a raised position.

The inner section 207 of substrate support 205 may define a number of lift pin locations 225. Lift pin locations 225 may be in the form of apertures (similar to guide holes 136) that extend through a top surface 211 of the inner section 207 of the substrate support 205. Each lift pin location 225 may receive a lift pin 230 that is positioned directly beneath the substrate 210. As best illustrated in FIG. 2D, the aperture of each lift pin location 225 may have a variable profile across a length of the aperture. For example, a top of each aperture (proximate top surface 211) may have a first diameter which may be sized to receive a top portion 231 of each lift pin 230. The inner walls defining each aperture may transition radially outward to accommodate larger portions of each lift pin 230, such as a flange 237. The inner walls may transition in a tapered and/or stepped fashion. In some embodiments, the contact between the inner walls and lower portions of the lift pins 230 may serve as a stop to set a maximum height of the lift pin 230. For example, the flange 237 may contact a transition surface (such as a stepped wall) of the inner walls to prevent the lift pins 230 from further raising upward.

The lift pins 230 may be vertically translatable relative to the top surface 211 of the substrate support 205 and/or the top surface 219 of the cover ring 215 to selectively raise and lower the substrate 210 relative to the substrate support 205 and/or cover ring 215. For example, each of the lift pins 230 may be coupled with a lift mechanism (similar to lift mechanism 138) that may selectively translate the lift pins 230 upward and downward within a respective one of the apertures. Vertical translation of the lift pins 230 may facilitate loading and unloading of the substrate 210. For example, the lift pins 230 may be translated upward to a raised position in which a top of each of the lift pins 230 extends above the top surfaces of the cover ring 215 and substrate 210 as illustrated in FIGS. 2C and 2D. When in the raised position, the lift pins 230 may enable a transfer apparatus, such as a transfer a robot, to grasp and/or otherwise support a bottom of the substrate 210 to transfer the substrate 210 into and out of a processing region of the processing chamber 200. The lift pins 230 may be translated downward to a lowered position in which the top of each lift pin 230 is below the top surface 211 of the substrate support 205 as illustrated in FIGS. 2A and 2B. This may enable the lift pins 230 to lower substrate 210 into the step 222 of substrate seat 220 for processing of the substrate 210. In the lowered position, the lift pins 230 may be recessed within the inner section 207 of the substrate support 205, with tops of each lift pin 230 being below the top surface 211 as best illustrated in FIG. 2A.

Figure 2E:
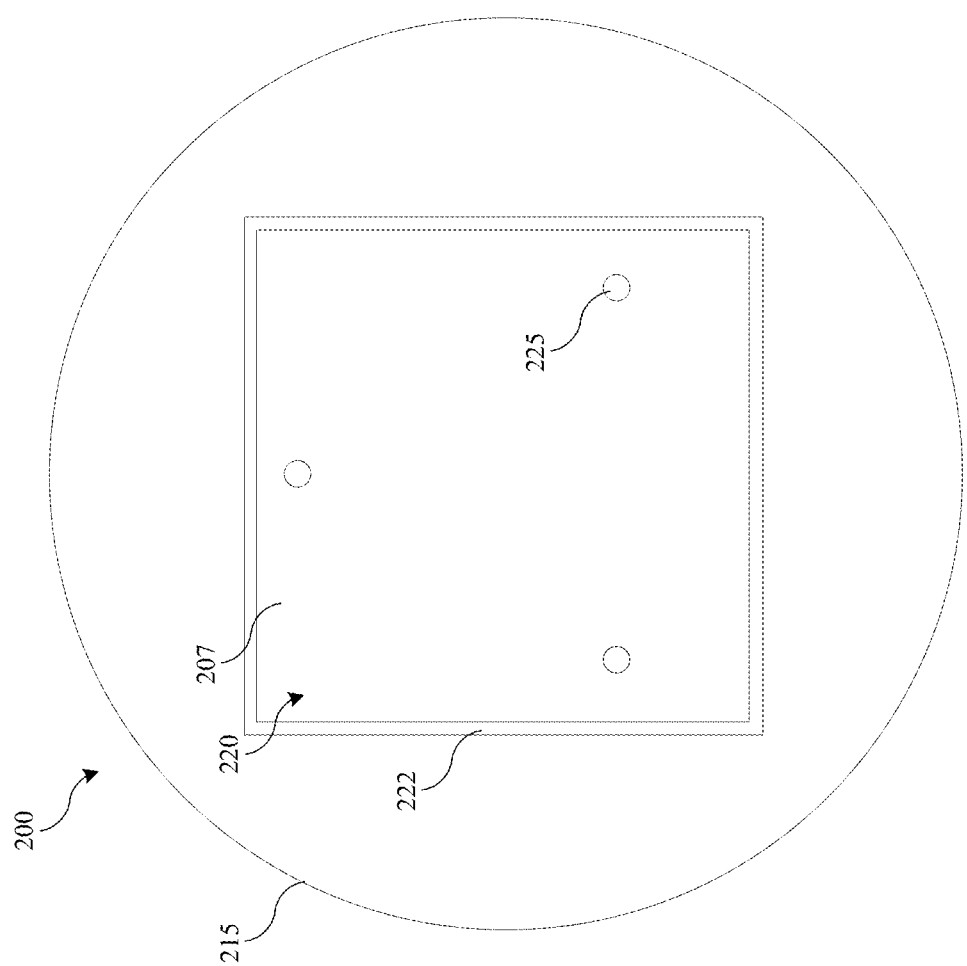
FIG. 2E shows a partial schematic top plan view of the processing chamber of FIG. 2.

FIG. 2E illustrates a schematic partial top plan view of the chamber 200 without substrate 210 according to one embodiment. As illustrated, the cover ring 215 extends over and covers an entire upward facing surface of the substrate support 205 that is radially outward of the central aperture, with the inner portion 207 being exposed within the central aperture. Lift pin locations 225 (and lift pins 230) may be arranged about the surface of the inner portion 207 radially inward of the substrate seat 220. Oftentimes, the lift pin locations 225 may be uniformly arranged at regular angular intervals about the inner portion 207 of the support plate 205. For example, three lift pin locations 225 may be disposed at regular angular intervals of 120 degrees relative to a center of the substrate support 205. In other embodiments, some or all of the lift pin locations 225 may be arranged at irregular intervals. The number of lift pin locations 225 may vary. For example, the substrate support 205 may define greater than or about 3 lift pin locations 225, greater than or about 4 lift pin locations 225, greater than or about 5 lift pin locations 225, greater than or about 6 lift pin locations 225, greater than or about 7 lift pin locations 225, or more. Oftentimes, fewer lift pin locations 225 may be utilized, with three lift pin locations 225 being most common. This may provide more lateral space between adjacent lift pins 230 in which to insert a portion of the transfer apparatus for transferring the substrate into and out of the chamber 200. Each of the lift pin locations 225 may be positioned at a same radial distance from the center of the substrate support 205. For example, each lift pin location 225 may be positioned at radial distances that are proximate edges of substrate seat 220. For example, the lift pin locations 225 may be positioned greater than or about 50%, greater than or about 60%, greater than or about 70%, greater than or about 80%, or greater than or about 90% of a distance from the center of the substrate support 205 to the inner edge of the substrate seat 220. In some embodiments, some or all of the lift pin locations 225 may be at different radial distances as at least one other lift pin location 225.

By positioning lift pins within the inner portion of the substrate support and seating the substrate on a step of a cover ring, the backside of the substrate may be fully sealed and protected from exposure to plasma or process gases that may etch or otherwise damage the backside of the substrate. Additionally, by moving the lift pins inward and using the lift pins to directly lift and lower the substrate, the size of the substrate support and/or chamber may be reduced. For example, by moving the lift pins inward, the number of components of (or coupled with) the substrate support that are radially outward of the substrate seat may be reduced, which may enable the extra space vacated by the lift pins to be removed. The reduction in substrate support and/or chamber size may provide several benefits over conventional chamber designs. For example, smaller substrate supports and/or chambers may improve the conductance and pressure uniformity within the chamber. The smaller substrate support and/or chamber size may result in an offset draw (due to the location of the vacuum pump) being moved closer to the center of the substrate support and/or chamber, which may make the pressure differential within the chamber more uniform across the substrate.

Figure 3:
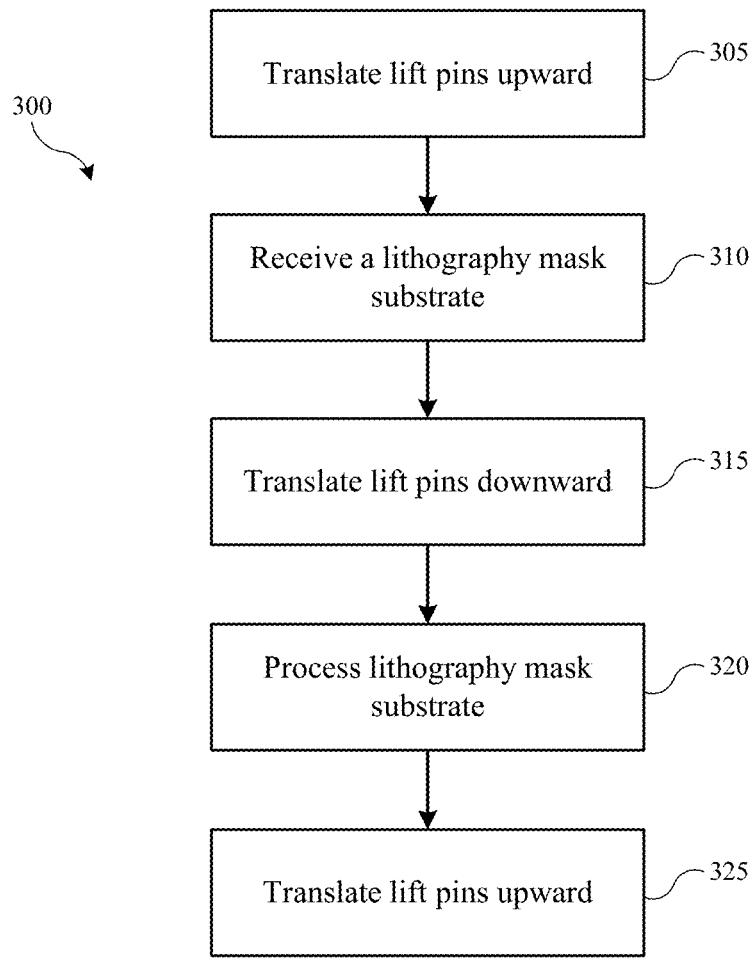
FIG. 3 shows exemplary operations in a method according to some embodiments of the present technology.

Turning to FIG. 3 is shown exemplary operations in a method 300 of processing a substrate according to embodiments of the present technology. Method 300 may be performed in a semiconductor substrate processing chamber, including chambers 100 and 200 described herein. Method 300 may include one or more operations prior to the initiation of the method. The method may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below.

It is to be understood that method 300 may be performed on any number of semiconductor substrates including lithography mask substrates, such as a photolithographic reticle or photomask. For example, an exemplary photomask structure may include one or more layers that may be utilized or patterned. Exposed materials at any time during the etch process may be or include metal materials, one or more dielectric materials, alloy layers, hard mask materials, or any other materials that may be used in photomasks or other substrates. Although any number of photomasks or other semiconductor structures may be encompassed by the present technology, in some embodiments the photomask may be an EUV photomask that may be patterned according to some embodiments of the present technology.

Method 300 may include translating a number of lift pins upward into a receiving position in which a top surface of each of the lift pins extends above a top surface of a cover ring at operation 305. A lithography mask substrate may be received atop the plurality of lift pins at operation 310. For example, a robot or other transfer apparatus may deliver the lithography mask substrate into the chamber and position the lithography mask substrate atop the lift pins, with the lithography mask substrate being aligned with a rectilinear substrate seat formed within the cover ring. Once the lithography mask substrate has been properly positioned atop the lift pins, the lift pins may be translated downward to a lowered position to position the lithography mask substrate within the substrate seat defined within the cover ring at operation 315. When in the lowered position each of the lift pins may be retracted within a body of a substrate support that is positioned beneath the cover ring.

Once the lithography mask substrate is seated within the substrate seat, for example, with peripheral edges of the lithography mask substrate supported by a step of the substrate seat, one or more processing operations may be performed on the lithography mask substrate at operation 320. For example, one or more front end processing, deposition, etching, polishing, cleaning, and/or other operations may be performed. For example, a particular processing operation may include forming a plasma of a precursor to produce plasma effluents. The plasma effluents may contact the lithography mask substrate and may etch a first layer of a mask through the material of the lithography mask substrate. The etching may be maintained until the pattern in the hardmask has been transferred through the first mask layer, which may expose a second layer of the photomask. Subsequent layers of the photomask may be etched in a similar manner to produce a lithography mask substrate having a desired profile.

After processing operations on the lithography mask substrate are complete, the lift pins may be translated upward into the receiving position to raise the lithography mask substrate out of the rectilinear substrate seat at operation 325. The transfer apparatus may then remove the processed substrate off of the lift pins and out of the chamber. The transfer apparatus may then position a new substrate atop the lift pins and the method may repeat.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A lithography mask processing chamber, comprising:
a substrate support comprising a plurality of lift pins that are vertically translatable relative to a top surface of the substrate support; and
a cover ring positioned atop the substrate support, the cover ring defining a rectilinear substrate seat, wherein:
a top surface of the rectilinear substrate seat is elevated above the top surface of the substrate support;
an outer periphery of the rectilinear substrate seat is positioned outward of the plurality of lift pins;
the rectilinear substrate seat defines an aperture through a thickness of the cover ring; and
a portion of the substrate support protrudes partially through the aperture.

2. The lithography mask processing chamber of claim 1, wherein:
the top surface of the rectilinear substrate seat is elevated above the top surface of the substrate support by a distance of between about 5 mils and 50 mils.

3. The lithography mask processing chamber of claim 1, wherein:
the rectilinear substrate seat comprises a step that extends about at least a portion of the aperture; and
the step is sized to support peripheral edges of a wafer that is to be processed within the lithography mask processing chamber.

4. The lithography mask processing chamber of claim 1, wherein:
a peripheral edge of the rectilinear substrate seat is sized such that the peripheral edge of the rectilinear substrate seat is spaced apart from a peripheral edge of a wafer being processed by between about 10 mils and 100 mils.

5. The lithography mask processing chamber of claim 1, wherein:
the substrate support is operable as a cathode.

6. The lithography mask processing chamber of claim 1, wherein:
each of the plurality of lift pins is positioned equidistant from a center of the substrate support.

7. The lithography mask processing chamber of claim 6, wherein:
the plurality of lift pins are positioned at equal angular intervals relative to the center of the substrate support.

8. The lithography mask processing chamber of claim 1, wherein:
the plurality of lift pins comprise at least three lift pins.

9. The lithography mask processing chamber of claim 1, wherein:
each of the plurality of lift pins is vertically translatable between a raised position in which a top of each of the plurality of lift pins extends above a top surface of the cover ring and a lowered position in which the top of each of the plurality of lift pins is below a top surface of the substrate support.

10. A lithography mask processing chamber, comprising:
a substrate support comprising three or more lift pins that are vertically translatable relative to a top surface of the substrate support, wherein the substrate support is operable as a cathode; and
a cover ring positioned atop the substrate support, the cover ring defining a rectilinear substrate seat that defines a rectilinear central aperture through a thickness of the cover ring, wherein:
a top surface of the rectilinear substrate seat is elevated above the top surface of the substrate support;
an outer periphery of the rectilinear substrate seat is positioned outward of the three or more lift pins; and
a portion of the substrate support protrudes partially through the aperture.

11. The lithography mask processing chamber of claim 10, wherein:
the cover ring extends over an entire upward facing surface of the substrate support that is radially outward of the rectilinear central aperture.

12. The lithography mask processing chamber of claim 10, wherein:
the substrate support comprises a rectilinear inner portion and an outer portion;
the rectilinear inner portion is raised relative to the outer portion; and
the rectilinear inner portion has a smaller area than the rectilinear central aperture.

13. The lithography mask processing chamber of claim 12, wherein:

the rectilinear inner portion extends upward through a portion of the rectilinear central aperture.

14. The lithography mask processing chamber of claim 10, wherein:
the cover ring comprises hexagonal boron nitride.

15. The lithography mask processing chamber of claim 10, wherein:
the rectilinear substrate seat comprises a step that extends about at least a portion of the rectilinear central aperture; and
the step is sized to support peripheral edges of a wafer that is to be processed within the lithography mask processing chamber.

16. The lithography mask processing chamber of claim 10, wherein:
each of the three or more lift pins is vertically translatable between a raised position in which a top of each of the three or more lift pins extends above a top surface of the cover ring and a lowered position in which the top of each of the three or more lift pins is below a top surface of the substrate support.

17. The lithography mask processing chamber of claim 10, wherein:
the three or more lift pins are positioned equidistant from a center of the substrate support; and
the three or more lift pins are positioned at equal angular intervals relative to the center of the substrate support.

18. A method of processing a lithography mask substrate, comprising:
translating a plurality of lift pins upward into a receiving position in which a top surface of each of the plurality of lift pins extends above a top surface of a cover ring;
receiving a lithography mask substrate atop the plurality of lift pins;
translating the plurality of lift pins downward to a lowered position to position the lithography mask substrate within a rectilinear substrate seat defined within the cover ring, wherein
in the lowered position each of the plurality of lift pins is retracted within a body of a substrate support that is positioned beneath the cover ring;
the rectilinear substrate seat defines an aperture through a thickness of the cover ring; and
a portion of the substrate support protrudes partially through the aperture; and
performing one or more processing operations on the lithography mask substrate.

19. The method of processing a lithography mask substrate of claim 18, further comprising:
translating the plurality of lift pins upward into the receiving position to raise the lithography mask substrate out of the rectilinear substrate seat upon performing the one or more processing operations.

* * * * *